United States Patent

Aoki

[11] Patent Number: 5,815,540
[45] Date of Patent: Sep. 29, 1998

[54] SEMICONDUCTOR INTEGRATED CIRCUIT DEVICE INCLUDING PLL CIRCUIT

[75] Inventor: Yasushi Aoki, Tokyo, Japan

[73] Assignee: NEC Corporation, Tokyo, Japan

[21] Appl. No.: 466,459

[22] Filed: Jun. 6, 1995

Related U.S. Application Data

[62] Division of Ser. No. 253,062, Jun. 2, 1994.

[30] Foreign Application Priority Data

Jun. 2, 1993 [JP] Japan ..................... 5-156297

[51] Int. Cl.$^6$ ..................................... H03D 3/24
[52] U.S. Cl. .......................... 375/376; 331/1 R; 331/1 A
[58] Field of Search ..................... 375/376, 371, 375/373, 375; 331/1 R, 12, 25, 1 A, 18, 2; 327/156, 158, 159

[56] References Cited

U.S. PATENT DOCUMENTS

| | | | |
|---|---|---|---|
| 3,979,691 | 9/1976 | Balliet | 331/1 A |
| 4,019,153 | 4/1977 | Cox, Jr. et al. | 331/1 A |
| 4,072,905 | 2/1978 | Keelty | 331/1 A |
| 4,131,861 | 12/1978 | Malaviya | 331/25 |
| 4,358,741 | 11/1982 | Nardin | 331/25 |
| 4,691,176 | 9/1987 | Hsiung et al. | 331/2 |
| 5,184,350 | 2/1993 | Dara | 375/376 |
| 5,231,650 | 7/1993 | Satomura | 375/371 |
| 5,347,232 | 9/1994 | Nishimichi | 331/1 A |

*Primary Examiner*—Stephen Chin
*Assistant Examiner*—Huong Luu
*Attorney, Agent, or Firm*—Sughrue, Mion, Zinn, Macpeak & Seas

[57] ABSTRACT

A semiconductor integrated circuit device including input and output registers, a data-processing circuit block disposed between the registers, a first PLL circuit for supplying a first output clock signal to the input register in response to an input clock signal, and a second PLL circuit for supplying a second output clock signal to the output register in response to the input clock signal. The input register transfers a data signal stored therein to the output register in response to the first output clock signal. The output register stores the data signal and transfers it to another device in response to the second output clock signal. The first and second PLL circuits supply the first and second output clock signals to the input and output registers with keeping the phase differences constant, respectively. The data signal stored in the input register can be correctly transferred to the output register, and the data signal stored in the output register can be correctly transferred to an input register of another semiconductor integrated circuit device even if the clock skew arises.

6 Claims, 7 Drawing Sheets

SEMICONDUCTOR INTEGRATED CIRCUIT DEVICE INCLUDING PLL CIRCUIT

This is a divisional of application Ser. No. 08/253,062 filed Jun. 2, 1994.

BACKGROUND OF THE INVENTION

1. Field of the Invention

The present invention relates to a semiconductor integrated circuit device, and more particularly to a semiconductor integrated circuit device including a digital Phase Locked Loop (PLL) circuit, which can be applied for digital signal processing apparatuses or systems such as a computer and a data transmission or exchange system.

2. Description of the Prior Art

A conventional digital signal processing system is shown in FIG. 1, which contains first and second mounting boards 7 and 8 and a clock signal generator 6 deposited outside the boards 7 and 8.

The first mounting board 7 has a clock signal distribution buffer 71 and two semiconductor Large Scale Integrated (LSI) circuit chips 72 and 73 for digital signal processing such as a gate array. A clock signal generated in the clock signal generator 6 is supplied to the distribution buffer 71 and is distributed to the LSI circuit chips 72 and 73, respectively.

Similarly, the second mounting board 8 has a clock signal distribution buffer 81 and two semiconductor LSI circuit chips 82 and 83 for digital signal processing. The clock signal supplied to the distribution buffer 81 is distributed to the LSI circuit chips 82 and 83, respectively.

The chip 72 receives a data signal from an LSI circuit chip (not shown) and transfers a data signal produced therein to the chip 73 mounted on the same board 7. The chip 73 transfers a data signal produced therein to the chip 82 mounted on the second mounting board 8.

The chip 82 receives the data signal transferred from the LSI circuit chip 73 and transfers a data signal produced therein to the chip 83. The chip 83 transfers a data signal produced therein to an LSI circuit chip (not shown).

The data signal transfers between the adjacent two chips are synchronized with the clock signal.

There is a problem with the conventional digital signal processing system shown in FIG. 1 in that the data signal transfers cannot be carried out correctly because of clock skew due to variation in wiring length and/or circuit load in the LSI chips 72, 73, 82 and 83 generated during their fabrication process sequence.

In particular, the problem becomes important in the case of the data transfer between the two LSI chips mounted on the different boards. In the system of FIG. 1, the clock signal is supplied to the LSI chip 73 through the clock signal distribution buffer 71 and is supplied to the LSI chip 82 through the clock signal distribution buffer 81, so that a time lag arises between the moments at which the LSI chips 73 and 82 receives the clock signals.

Generally, due to dispersion in electrical characteristics, an LSI chip fluctuates in delay time from the input of a clock signal to the output of its data signal and fluctuates in set up hold time from the input of a data signal. As a result, the data signal transfers between the adjacent two ones of the LSI chips 72, 73, 82 and 83 tends to be carried out incorrectly.

Further, there is another problem in that the above data signal transfers are difficult to carry out when the clock signal is high in frequency.

SUMMARY OF THE INVENTION

Accordingly, an object of the present invention is to provide a semiconductor integrated circuit device which can transfer its data signal correctly to another device in response to a clock signal.

Another object of the present invention is to provide a semiconductor integrated circuit device which can transfer its data signal correctly to another device even if the clock signal is high in frequency.

A semiconductor integrated circuit device according to a first aspect of the present invention includes a PLL circuit. The PLL circuit receives an input clock signal and produces an output clock signal having a constant phase shift or change relative to the input clock signal.

The PLL circuit has phase-shifting means for providing a phase shift or change to the input clock signal to make the output clock signal, and a phase comparator for comparing in phase the input clock signal and the output clock signal and for supplying a control signal to the phase comparator based on the result of comparison. The phase-shifting means is controlled so that the phase shift is kept constant by the control signal.

With the semiconductor integrated circuit device according to the first aspect of the present invention, the PLL circuit provides the output clock signal having a constant phase shift or change relative to the input clock signal.

Therefore, when a data signal stored in a register is transferred to another register in response to the output clock signal produced by the semiconductor integrated circuit device according to the first aspect, the data signal can be correctly transferred between the registers.

As a result, when a plurality of the registers operate in response to the output clock signal produced by the device, the data signal stored in one of the registers can be correctly transferred to another one of the registers even if the clock skew arises.

In a preferred embodiment, the input clock signal and the output signal are supplied to the phase comparator after being divided in frequency by n where n is an integer. In the case, there is an advantage that the data signal transfer can be correctly carried out even if the input clock signal is high in frequency.

In another preferred embodiment, the output clock signal is supplied to the phase comparator after being given a fixed delay in phase compared with the input clock signal.

A semiconductor integrated circuit device according to a second aspect of the present invention includes a first register for storing an input data signal, a second register for storing an output data signal, a data-processing circuit block disposed between the first and second registers, and a first PLL circuit for supplying a first output clock signal to the first register in response to an input clock signal, and a second PLL circuit for supplying a second output clock signal to the second register in response to the input clock signal.

The first register transfers the input data signal stored therein to the data-processing circuit block in response to the first output clock signal.

The data-processing circuit block digitally processes the input data signal received from the first register and transfers the input data signal thus digitally-processed to the second register.

The second register stores the input data signal thus digitally-processed received from the data-processing circuit block and transfers the input data signal stored therein as the output data signal to another device in response to the second output clock signal.

The first PLL circuit receives the input clock signal and supplies the first output clock signal to the first register while keeping the phase difference between the input clock signal and the first output clock signal at a first constant.

The second PLL circuit receives the input clock signal and supplies the second output clock signal to the second register while keeping the phase difference between the input clock signal and the second output clock signal at a second constant.

With the semiconductor integrated circuit device according to the second aspect of the present invention, the first PLL circuit provides the first output clock signal having the phase difference of the first constant relative to the input clock signal to the first register, and the second PLL circuit provides the second output clock signal having the phase difference of the second constant relative to the input clock signal to the second register.

Therefore, the data signal stored in the first register can be correctly transferred to the second register through the data-processing circuit block to the second register even if the clock skew arises.

As a result, when two of the semiconductor integrated circuit devices according to the second aspect are arranged so that the output data signal stored in the second register of one of the devices is transferred to the first register of the other in response to the input clock signal, the output data signal can be correctly transferred between the devices even if the clock skew arises.

In a preferred embodiment, to keep the phase difference between the input clock signal and the first output clock signal at the first constant, the input clock signal and the first output clock signal are compared in phase after being divided in frequency by n where n is an integer.

In this case, there is an advantage that the data signal transfer can be correctly carried out even if the input clock signal is high in frequency.

DESCRIPTION OF THE PREFERRED EMBODIMENTS

Figure 1:
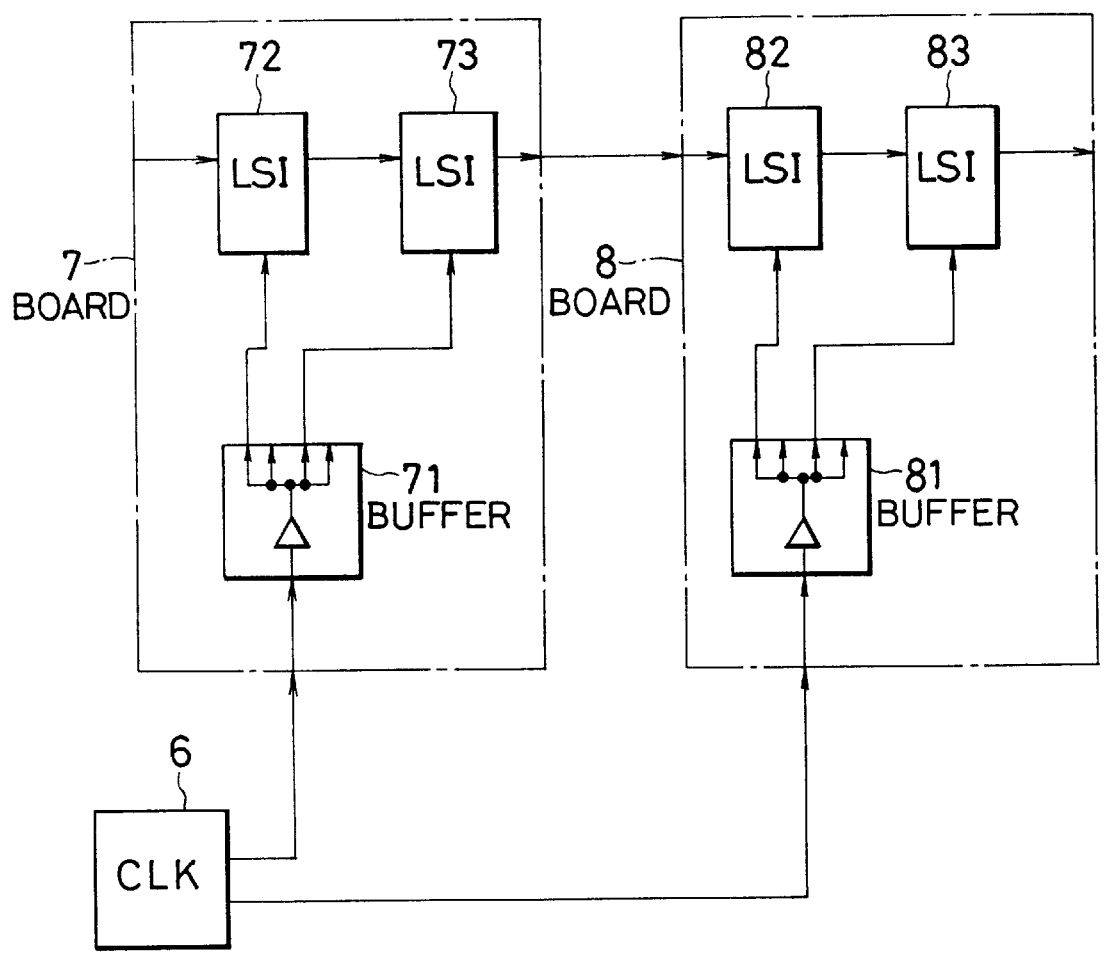
FIG. 1 is a functional block diagram showing a conventional semiconductor integrated circuit device for digital signal processing.

Preferred embodiments of the present invention will be described below while referring to the drawings attached.

[First Embodiment]

FIGS. 2 to 6 show a semiconductor integrated circuit device for digital signal processing according to a first embodiment.

Figure 2:
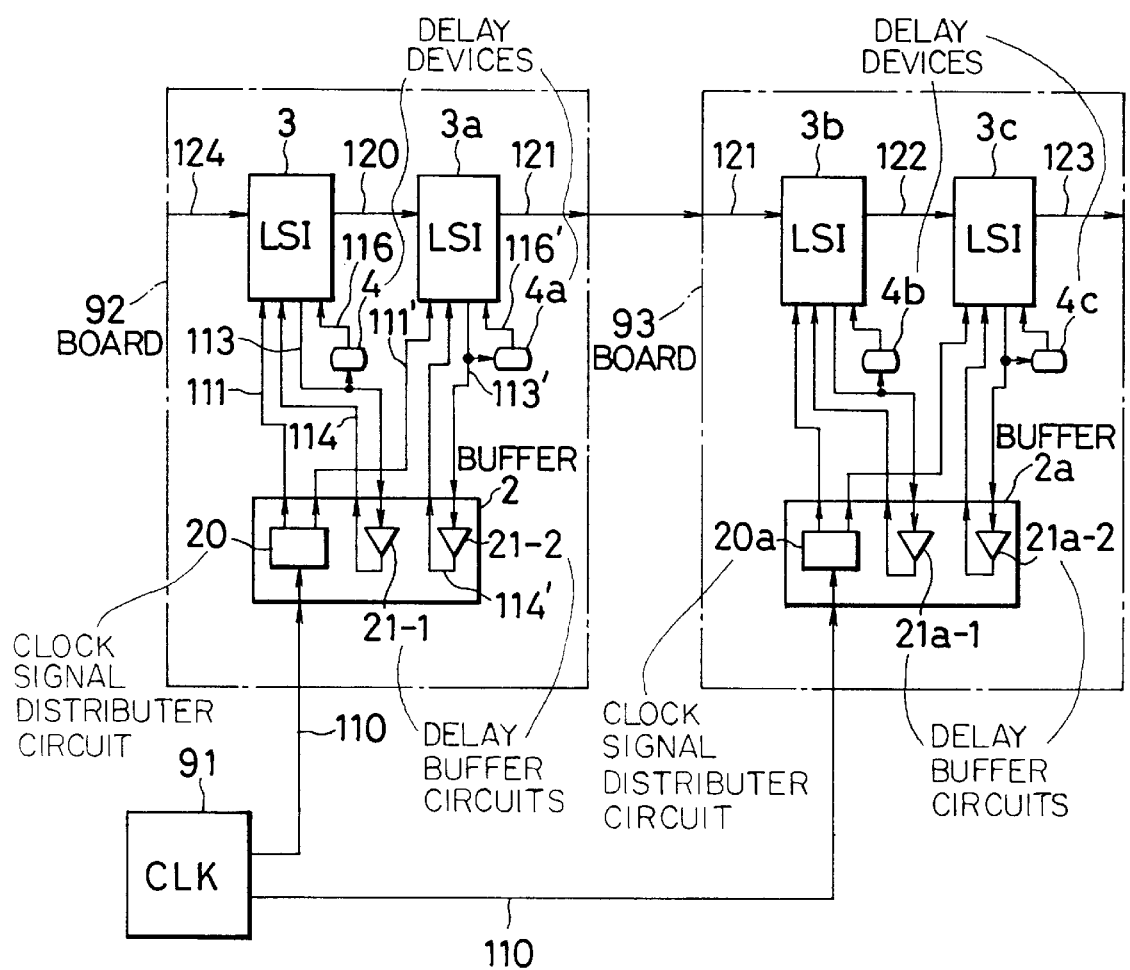
FIG. 2 is a functional block diagram showing a semiconductor integrated circuit device according to a first embodiment of the present invention.

As shown in FIG. 2, the semiconductor integrated circuit device contains two mounting boards 92 and 93, and a common clock signal generator 91 mounted outside the boards 92 and 93.

On the mounting board 92, there are two LSI circuit chips 3 and 3a for digital signal processing, a clock signal distribution buffer 2, and two delay devices 4 and 4a for the respective LSI circuit chips 3 and 3a. On the mounting board 93, there are two LSI circuit chips 3b and 3c for digital signal processing, a clock signal distribution buffer 2a, and two delay devices 4b and 4c for the respective LSI circuit chips 3b and 3c.

The clock signal distribution buffer 2 on the board 92 has a clock signal distributer circuit 20, a delay buffer circuit 21-1 for the LSI chip 3, and a delay buffer circuit 21-2 for the LSI circuit chip 3a. The clock signal distribution buffer 2a on the board 93 has a clock signal distributer circuit 20a, a delay buffer circuit 21a-1 for the LSI circuit chip 3b, and a delay buffer circuit 21a-2 for the LSI circuit chip 3c.

The clock signal distributer circuit 20 receives a clock signal 110 generated in the clock signal generator 91 to distribute the signal 110 to the LSI circuit chips 3 and 3a as input clock signals 111 and 111', respectively.

The delay buffer circuit 21-1 receives a signal 113 outputted from the LSI circuit chip 3, and gives a fixed phase delay to the signal 113 to send it again to the LSI circuit chip 3 as a signal 114. The signal 113 is also supplied to the delay device 4. The delay device 4 gives a fixed phase delay to the signal 113 and sends it again to the LSI circuit chip 3 as a signal 116.

The delay buffer circuit 21-2 has the same function as the delay buffer circuit 21-1. That is, the delay buffer circuit 21-2 receives a signal 113' outputted from the LSI circuit chip 3a and gives a fixed phase delay to the signal 113' to send it again to the LSI circuit chip 3a. The signal 113' is also supplied to the delay device 4a. The delay device 4a gives a fixed phase delay to the signal 113' and sends it again to the LSI circuit chip 3a as a signal 116'.

The clock signal distributer circuit 20a of the distribution buffer 2a has the same function as the clock signal distributer circuit 20. The delay buffer circuits 21a-1 and 21a-2 have the same functions as the delay buffer circuits 21-1 and 21-2, respectively. Therefore, detailed description about them are omitted here.

The LSI circuit chip 3 receives a data signal 124 transferred from an LSI circuit chip (not shown), and transfers a data signal 120 produced therein through digital processing to the LSI circuit chip 3a mounted on the same mounting board 92. The LSI circuit chip 3a receives the data signal 120 and transfers a data signal 121 produced therein through digital processing to the LSI circuit chip 3b mounted on the different mounting board 93.

The LSI circuit chip 3b receives the data signal 121 and transfers a data signal 122 produced therein through digital processing to the LSI circuit chip 3c mounted on the same board 93. The LSI circuit chip 3c receives the data signal 122 and transfers a data signal 123 produced therein through digital processing to another LSI circuit chip (not shown).

The data signal transmissions between the adjacent chips are carried out in response to the clock signal 110.

Figure 3:
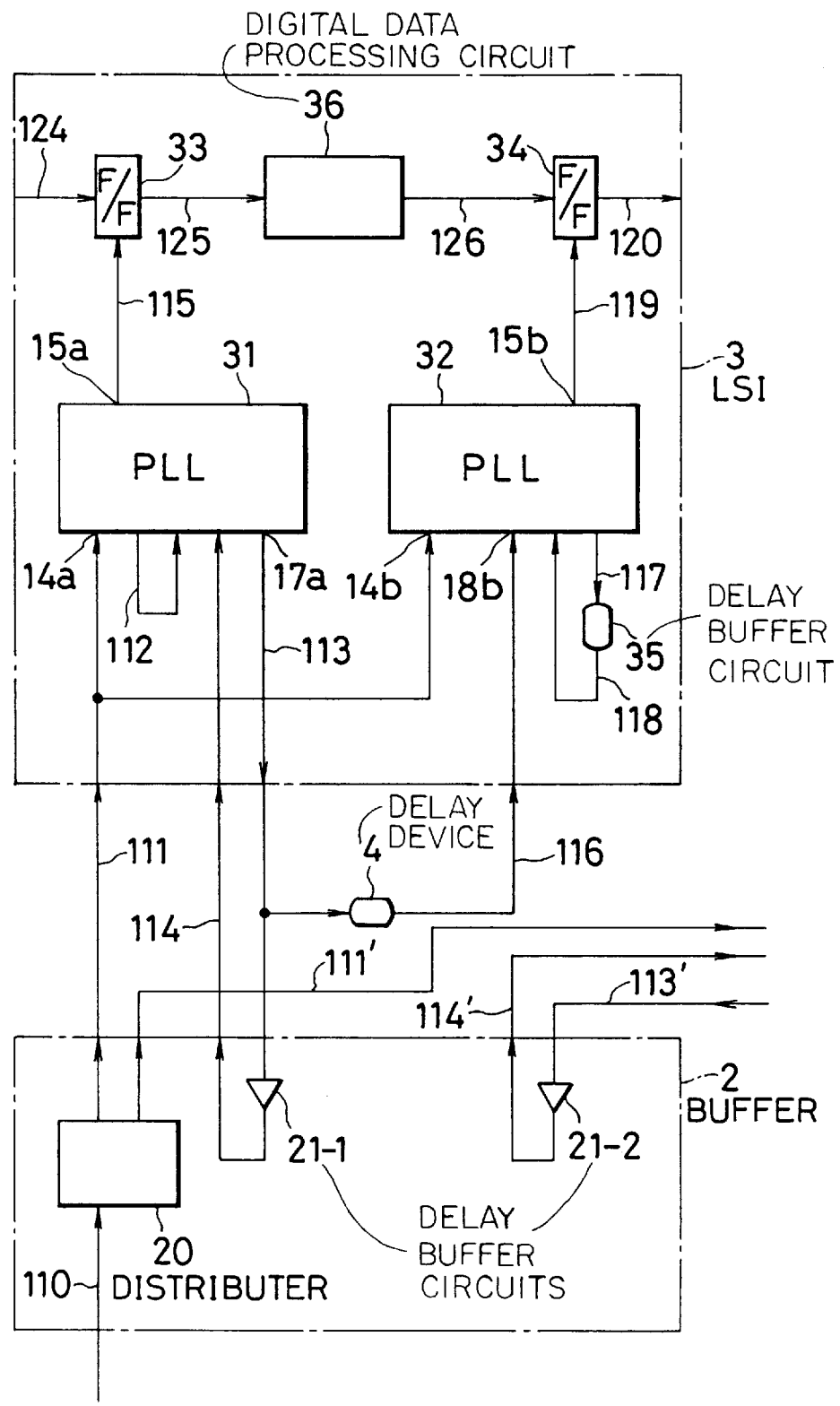
FIG. 3 is a functional block diagram showing a clock signal distributor and LSI circuit chips of the semiconductor integrated circuit device shown in FIG. 2.

Referring to FIG. 3, the configuration and function of the LSI circuit chip 3 is described in detail. The other LSI circuit chips 3a, 3b and 3c are the same in configuration and function as the chip 3, and a detailed description about them is omitted here for the sake of simplification.

As shown in FIG. 3, the LSI circuit chip 3 contains two PLL circuits 31 and 32, a delay buffer circuit 35 for providing a fixed phase delay, an input register 33 made of a flipflop for latching or storing a data signal, an output register 34 made of a flipflop for latching or storing a data signal, and a circuit block 36 for digital data processing deposited between the input and output registers 33 and 34.

Figure 4:
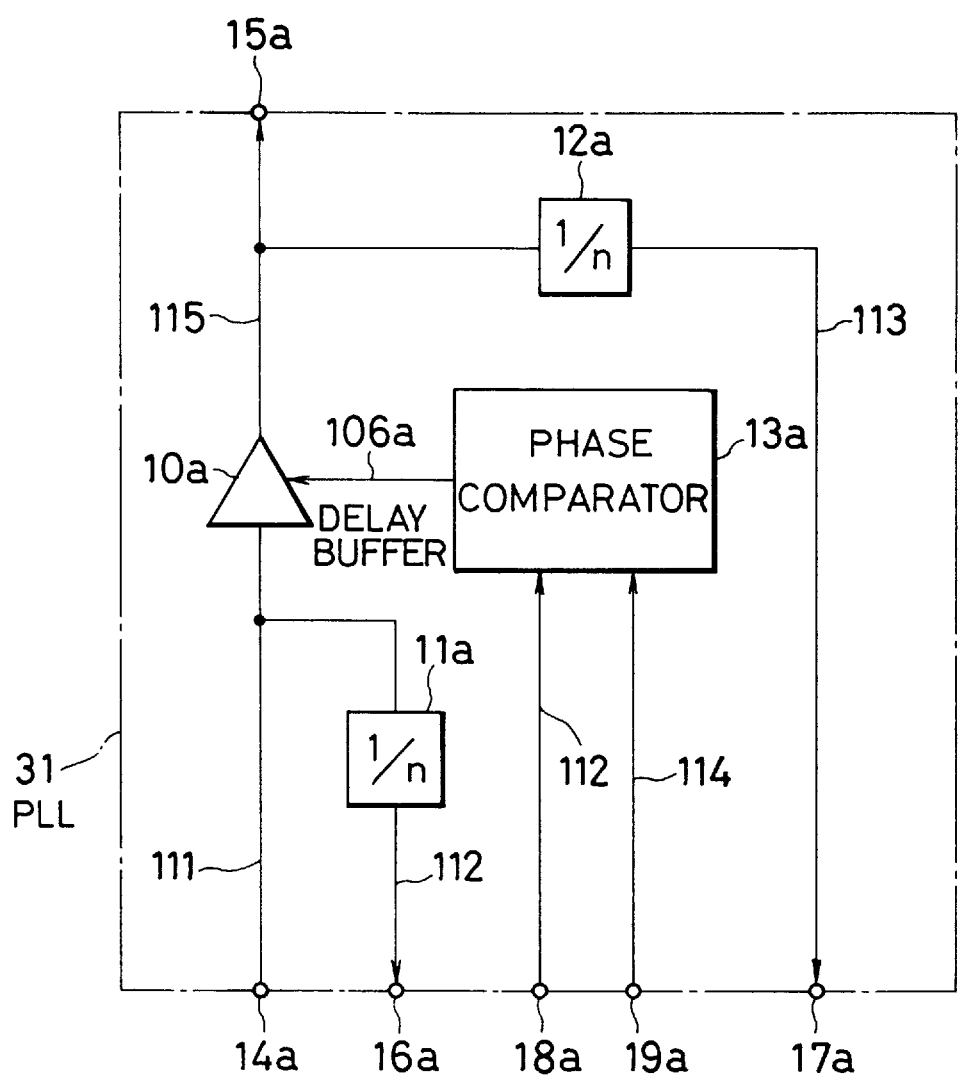
FIG. 4 is a functional block diagram showing a first PLL circuit of the LSI circuit chip shown in FIG. 3.
Figure 5:
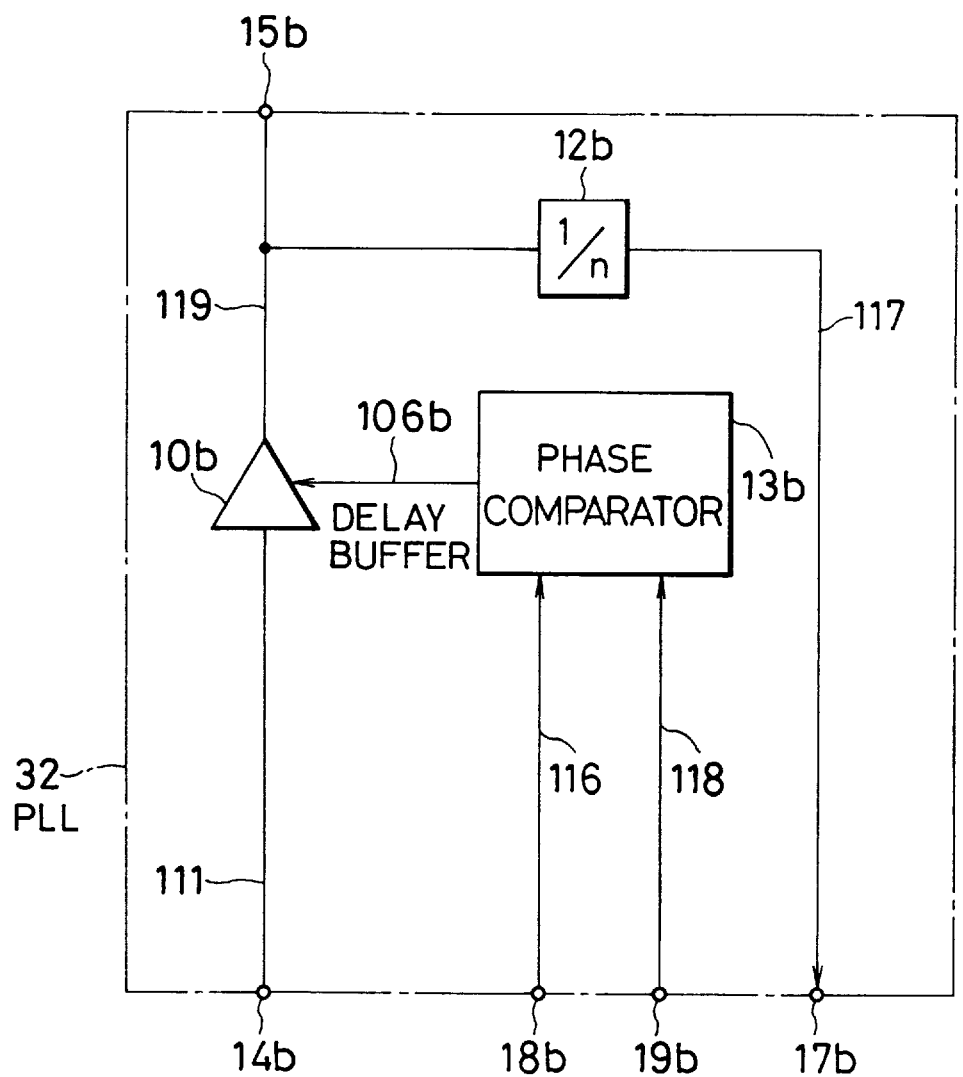
FIG. 5 is a functional block diagram showing a second PLL circuit of the LSI circuit chip shown in FIG. 3.

The PLL circuits 31 and 32 have configurations as shown in FIGS. 4 and 5, respectively.

In FIG. 4, the PLL circuit 31 has a variable delay buffer 10a for providing a variable phase delay to the input clock signal 111, a phase comparator 13a for controlling the delay buffer 10a, and two frequency dividers 11a and 12a for frequency-dividing by n where n is an integer.

The variable delay buffer 10a receives the input clock signal 111 supplied through an input end 14a of the PLL circuit 31 and gives a variable phase delay to the signal 111 to produce an output clock signal 115. The output clock signal 115 thus delayed in phase is sent through an output end 15a of the PLL circuit 31 to the input register 33. In response to the output clock signal 115, the input register 33 transfers the data signal 124 stored therein to the circuit block 36 as the data signal 125.

The phase delay given by the delay buffer 10a varies according to the control signal 106a sent from the phase comparator 13a.

The frequency divider 11a divides in frequency by n the input clock signal 111, and sends it to an output end 16a of the PLL circuit 31 as a phase-comparing signal 112. As shown in FIG. 3, the output end 16a is connected to an input end 18a of the PLL circuit 31, so that the signal 112 thus frequency-divided is inputted into the phase comparator 13a.

The frequency divider 12a divides in frequency by n the output clock signal 115 outputted from the delay buffer 10a, and sends it to an output end 17a of the PLL circuit 31 as a phase-comparing signal 113. As shown in FIG. 3, the signal 113 is sent through the output end 17a to the delay buffer circuit 21-1 of the clock signal distribution buffer 2. The delay buffer circuit 21-1 gives a fixed phase delay to the signal 113 thus frequency-divided and sends it again to the PLL circuit 31 as a phase-comparing signal 114. The signal 114 thus delayed in phase is inputted through an input end 19a of the PLL circuit 31 into the phase comparator 13a.

The phase comparator 13a compares in phase the phase-comparing signals 112 and 114 and sends the control signal 106a to the delay buffer 10a based on the result of comparison or phase difference between the signals 112 and 114. Thus, the PLL circuit 31 keeps the phase difference between the input and output clock signals 111 and 115 constant.

In detail, the predetermined, fixed phase delay is given by the delay buffer circuit 21-1 to the phase-comparing signal 114 based on the output clock signal 115 and a variable phase delay is given by the delay buffer 10a to the output clock signal 115. Thus, the phase-comparing signals 112 and 114 are kept equal in phase to each other, providing the constant or locked phase difference between the input and output clock signals 111 and 115.

As a result, the output clock signal 115 is kept equal in phase to the clock signal 110.

The signal 113 is also supplied to the delay device 4 disposed between the LSI circuit chip 3 and the buffer 2, given a fixed phase delay therein, and be sent to the PLL circuit 32 as a phase-comparing signal 116.

As shown in FIG. 5, the PLL circuit 32 has a variable delay buffer 10b for providing a variable phase delay to the input clock signal 111, a phase comparator 13b for controlling the delay buffer 10b, and a frequency divider 12b for frequency-dividing by n where n is an integer.

The variable delay buffer 10b receives the input clock signal 111 supplied through an input end 14b of the PLL circuit 32 and gives a variable phase delay to the signal 111 to produce an output clock signal 119. The output clock signal 119 thus delayed in phase is sent through an output end 15b of the PLL circuit 32 to the output register 34. In response to the output clock signal 119, the output register 34 transfers the data signal 126 stored therein to the input register of the LSI circuit chip 3a as the data signal 120.

The phase delay given by the delay buffer 10b varies according to the control signal 106b from the phase comparator 13b.

The frequency divider 12b divides in frequency by n the output clock signal 119 outputted from the delay buffer 10b, and sends it to an output end 17b of the PLL circuit 32 as a phase-comparing signal 117.

As shown in FIG. 3, the phase-comparing signal 117 is sent through the output end 17b to the delay buffer circuit 35 formed adjacent to the PLL circuit 32. The delay buffer circuit 35 gives a fixed phase delay to the signal 117 thus frequency-divided and sends it again to the PLL circuit 32 as a phase-comparing signal 118. The signal 118 thus delayed in phase is inputted through an input end 19b of the PLL circuit 32 into the phase comparator 13b.

The phase-comparing signal 116 sent from the delay device 4 is inputted through an input end 18b of the PLL circuit 32 into the phase comparator 13b.

The phase comparator 13b compares in phase the phase-comparing signals 116 and 118 and sends the control signal 106b to the delay buffer 10b based on the result of the comparison or phase difference between the signals 116 and 118. Thus, the PLL circuit 32 keeps the phase difference between the input and output clock signals 111 and 119 constant.

In detail, the predetermined, fixed phase delay is given by the delay buffer circuit 35 to the phase-comparing signal 117 based on the output clock signal 119 and a variable phase delay is given by the delay buffer 10b to the output clock signal 119. Thus, the phase-comparing signals 116 and 118 are kept equal in phase to each other, resulting in the constant or locked phase difference between the input and output clock signals 111 and 119.

Figure 6:
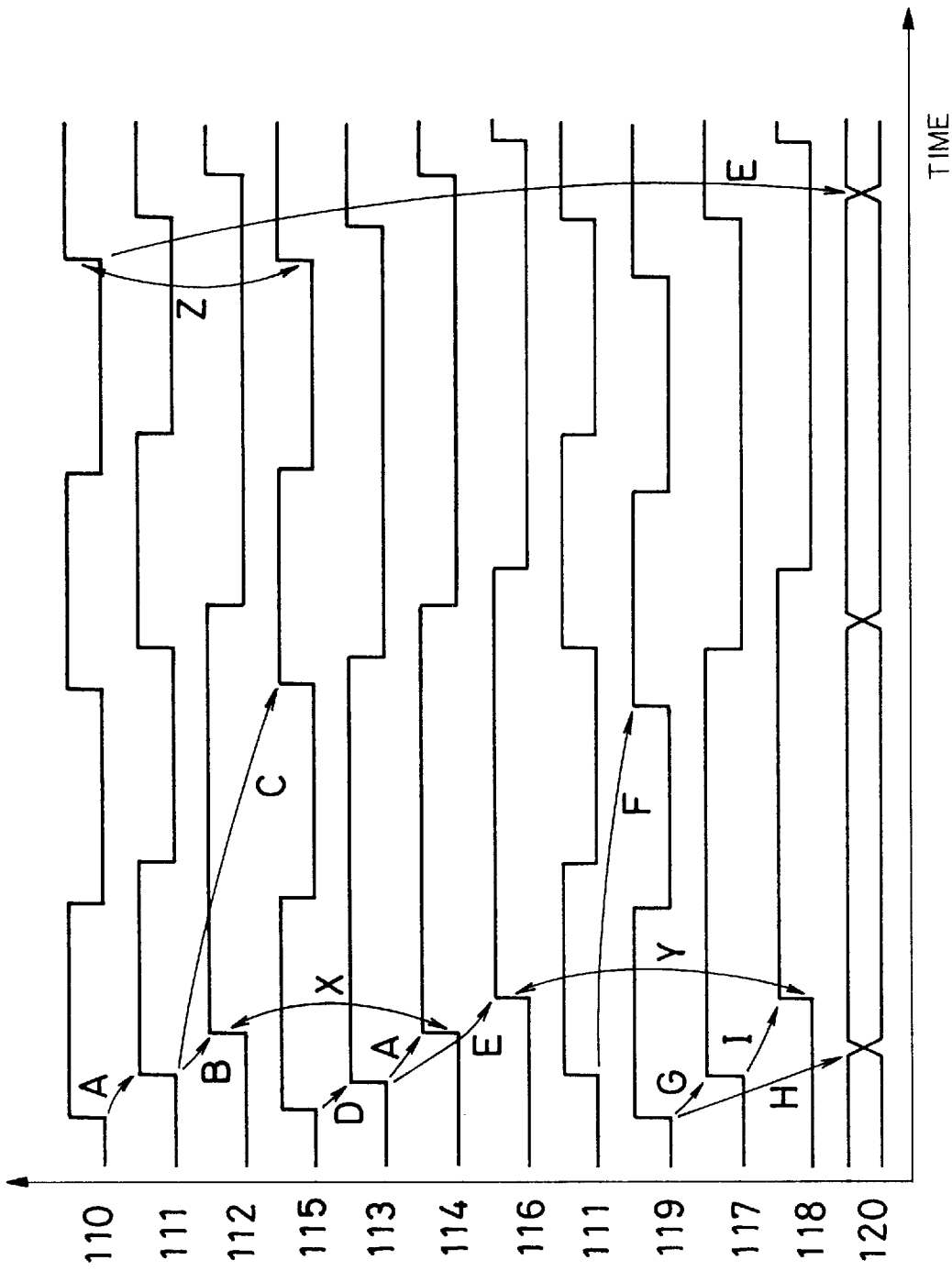
FIG. 6 is a time chart showing the operation of the semiconductor integrated circuit device shown in FIG. 2.

Referring to FIG. 6, the operation of the semiconductor integrated circuit device as described above is shown below.

As shown in FIG. 6, the clock signal 111 sent to the variable delay buffer 10a of the PLL circuit 31 has a fixed phase delay A compared with the clock signal 110 of a square wave. The fixed phase delay A is given by the clock signal distributer circuit 20.

The phase-comparing signal 112 sent to the phase comparator 13a of the PLL circuit 31 has a fixed phase delay B compared with the clock signal 111. In other words, the signal 112 has a time delay (A+B) compared with the clock signal 110. The fixed phase delay B is given by the frequency divider 11a.

The output clock signal 115 sent to the input register 33 has a variable phase delay C compared with the input clock signal 111. In other words, the output clock signal 115 has a time delay (A+C) compared with the clock signal 110. The variable phase delay C is given by the variable delay buffer 10a so that the output clock signal 115 is kept equal in phase to the clock signal 110, as indicated by the reference character Z.

The phase-comparing signal 113 sent to the delay buffer circuit 21-1 has a fixed delay D of phase compared with the output clock signal 115. In other words, the signal 113 has a time delay (A+C+D) compared with the clock signal 110. The fixed phase delay D is given by the frequency divider 12a.

The phase-comparing signal 114 sent to the phase comparator 13a has the same phase delay as A compared with the phase-comparing signal 113. In other words, the signal 114 has a time delay (2A+C+D) compared with the clock signal 110. The fixed delay A is given by the delay buffer circuit 21-1.

As shown by the reference character X in FIG. 6, the phase-comparing signals 114 and 112 are kept equal in phase to each other by changing the phase delay C. The phase accordance between the signals 114 and 112 is made by the phase comparator 13a and variable delay buffer 10a in the PLL circuit 31.

The phase-comparing signal 116 sent to the phase comparator 13b of the PLL circuit 32 has a fixed phase delay E compared with the phase-comparing signal 113. In other words, the signal 116 has a time delay (A+C+D+E) compared with the clock signal 110. The fixed delay E is given by the delay device 4.

The output clock signal 119 sent to the output register 34 has a variable phase delay F compared with the input clock signal 111. In other words, the output clock signal 119 has a time delay (A+F) compared with the clock signal 110. The variable phase delay F is given by the variable delay buffer 10b.

Different from the output clock signal 115, the output clock signal 119 is not equal in phase to the clock signal 110. The output clock signal 119 is controlled so that the phase difference between the clock signal 110 and the data signal 120 is equal to E by changing the phase delay F. The control of the signal 119 is made by the phase comparator 13b and variable delay buffer 10b in the PLL circuit 32.

The phase-comparing signal 117 sent to the delay buffer 35 has a fixed phase delay G compared with the clock signal 119. In other words, the signal 117 has the time delay (A+F+G) compared with the clock signal 110. The fixed phase delay G is given by the frequency divider 12b.

The phase-comparing signal 118 sent to the phase comparator 13b has a fixed phase delay I compared with the phase-comparing signal 117. In other words, the signal 118 has a time delay (A+F+G+I) compared with the clock signal 110. The fixed phase delay I is given by the delay buffer circuit 35.

As shown by the reference character Y in FIG. 6, the phase-comparing signals 118 and 116 are kept to be equal in phase to each other by changing the phase delay F using the phase comparator 13b and the variable delay buffer 10b in the PLL circuit 32.

The data signal 120 outputted from the output register 34 has a fixed phase delay H compared with the output clock signal 119. In other words, the data signal 120 has the time delay (A+F+H) compared with the clock signal 110. The fixed delay H is given by the output register 34.

As a result, the data signal 120 retains the same phase delay as E compared with the clock signal 110 by changing the phase delay F using the phase comparator 13b and the variable delay buffer 10b in the PLL circuit 32.

With the semiconductor integrated circuit device of the first embodiment, the PLL circuit 31 provides the output clock signal 115 which is equal in phase to the clock signal 110 to the input register 33, and the PLL circuit 32 provides the output clock signal 119 so that the phase-comparing signals 116 and 118 are equal in phase to each other. Then, the data signal 120 having the constant phase delay of E compared with the clock signal 110 is outputted from the output register 34.

As a result, the delay time of the data signal output is kept constant and a sufficient set up hold time is obtained. Therefore, the data signal 124 stored in the input register 33 can be correctly transferred through the circuit block 36 to the output register 34 and then outputted from the output register 34 as the data signal 120 even if the clock skew arises.

Further, the LSI circuit chips 3a, 3b and 3c are the same in configuration and the same clock signal 110 is supplied thereto in the same way as the LSI circuit chip 3, so that data signal transfer can be carried out not only inside the respective chips 3a, 3b and 3c but also among these chips.

In addition, prior to phase comparison, the input clock signal 111 and the output clock signal 115 are frequency divided by n in the PLL circuit 31 to produce the phase-comparing signals 114 and 113, and the output clock signal 119 is frequency divided by n in the PLL circuit 32 to produce the phase-comparing signal 117. Therefore, even if the clock signal 110 is high in frequency, the data signal transfer can be correctly carried out.

In the first embodiment, since the clock signal distributer circuit 20 and the delay buffer circuit 21-1 are formed in the same device or the clock signal distribution buffer 2, there arises the same relative fluctuation or variation in phase delay in the circuits 20 and 21-1 due to variations in fabrication and operating conditions. Accordingly, there is an advantage that the phase delay between the clock signal 110 and the input clock signal 111 is kept relatively equal to that between the signal 113 and the phase-comparing signal 110 even if the fabrication and operating conditions change.

Similarly, because the output register 34 and the delay buffer 35 are formed in the same device or the LSI circuit chip 3, there arises the same relative fluctuation or variation in phase delay in the register 34 and the delay buffer 35 due to the same reason. Accordingly, there is the same advantage as as provided by the circuits 20 and 21-1.

In the embodiment, since the delay device 4 is deposited outside the LSI circuit chip 3 and the clock signal distribution buffer 2, there is an additional advantage that the phase delay of the output signal 120 compared with the clock signal 110 can be easily changed by adjusting the fixed phase delay E of the device 4.

The output signal 120 is controlled to be delayed in phase compared with the clock signal 110. Thus, there is a possibility that the data signal 126 transferred from the circuit block 36 is not latched in the output register 34. However, the possibility can be easily removed by providing a retiming measure using a reversed clock signal of the output clock signal 119 prior to the output register 34.

[Second Embodiment]

Figure 7:
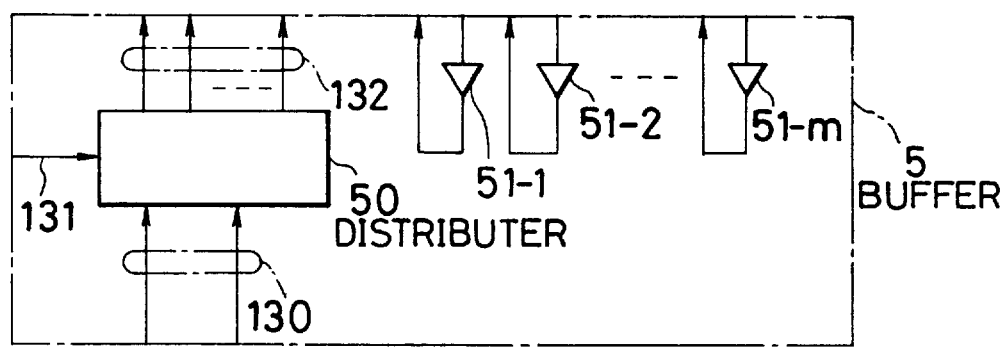
FIG. 7 is a functional block diagram showing a clock signal distribution buffer of a semiconductor integrated circuit device according to a second embodiment of the present invention.

FIG. 7 shows a clock signal distribution buffer 5 of a semiconductor integrated circuit device according to a second embodiment.

In FIG. 7, the clock signal distribution buffer 5 contains a clock signal distributer circuit 50 and m delay buffer circuits 51-1, 51-2, . . . , 51-m for respective m LSI circuit chips (not shown), where m is an integer.

The clock signal distributer circuit 50 receives two clock signals 130 generated in two clock signal generators (not shown), respectively.

On the other hand, the circuit 50 receives a selection signal 131 to select one of the clock signals 130, and distributes the signal thus selected to the LSI chips as m clock signals 132, respectively. The clock signals 130 are alternately supplied to the circuit 50 by controlling the selection signal 131.

Each of the delay buffer circuits 51-1, 51-2, . . . , 51-m receives an output signal from a corresponding one of the m LSI circuit chips and gives a fixed phase delay to the output signal to send it again to the corresponding one of the LSI circuit chips.

The other configuration and function are the same as the first embodiment except for the number of the LSI circuit chips, so that further description about them is omitted here.

In the second embodiment, one of the two clock signals 130 are selectively supplied to the circuit 50, in other words, the clock signal input are doubled. Therefore, even if any malfunction or trouble arises in the clock signal generator presently used, another one of the clock signal generators as a spare starts to supply the clock signal 130 to the circuit 50 immediately, providing improved security about the clock signal.

The clock signals 132 supplied to the respective LSI chips are adjusted in phase by PLL circuits formed in the corresponding chips in the same way as the first embodiment, so that there arises no problem even if the phase difference between the two clock signals 130 is ignored.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor integrated circuit device comprising:
   a first register for storing an input data signal;
   a second register for storing an output data signal;
   a data-processing circuit block disposed between said first register and said second register;
   a first phase-locked loop (PLL) circuit for supplying a first output clock signal to said first register in response to an input clock signal; and
   a second PLL circuit for supplying a second output clock signal to said second register in response to said input clock signal;
   said first register transferring said input data signal stored therein to said data-processing circuit block in response to said first output clock signal;
   said data-processing circuit block receiving to digitally process said input data signal from said first register and transferring said input data signal thus digitally-processed to said second register;
   said second register receiving to store said input data signal digitally-processed from said data-processing circuit block and transferring said input data signal stored therein as said output data signal to another device in response to said second output clock signal;
   said first PLL circuit receiving said input clock signal and supplying said first output clock signal to said first register while keeping a first phase difference between said input clock signal and said first output clock signal at a first constant; and
   said second PLL circuit receiving said input clock signal and supplying said second output clock signal to said second register while keeping a second phase difference between said input clock signal and said second output clock signal at a second constant.

2. A semiconductor integrated circuit device as claimed in claim 1, wherein
   said first PLL circuit generates a first phase-comparing signal based on said input clock signal and a second phase-comparing signal based on said first output clock signal, said first PLL circuit uses said first and second phase-comparing signals to keep said first phase difference between said input clock signal and said first output clock signal at said first constant; and
   said second PLL circuit generates a third phase-comparing signal based on said input clock signal and a fourth phase-comparing signal based on said second output clock signal, said second PLL circuit uses said third and fourth phase-comparing signals to keep said second phase difference between said input clock signal and said second output clock signal at said second constant.

3. A semiconductor integrated circuit device as claimed in claim 2, wherein
   said first phase-comparing signal and third phase-comparing signal are obtained by dividing in frequency said input clock signal by n where n is an integer;
   said second phase-comparing signal is obtained by dividing in frequency said first output clock signal by n; and
   said fourth phase-comparing signal is obtained by dividing in frequency said second output clock signal by n.

4. A semiconductor integrated circuit device as claimed in claim 2, further comprising:
   first phase-delaying means for delaying said second phase-comparing signal in phase by a first fixed phase amount;
   second phase-delaying means for delaying said third phase-comparing signal in phase by a second fixed phase amount; and
   third phase-delaying means for delaying said fourth phase-comparing signal in phase by a third fixed phase amount.

5. A semiconductor integrated circuit device as claimed in claim 4, wherein
   said first phase-delaying means and said second phase-delaying means are disposed outside said semiconductor integrated circuit device; and
   said third phase-delaying means is disposed in the semiconductor integrated circuit device.

6. A semiconductor integrated circuit device as claimed in claim 5, further comprising a clock signal distributing means for distributing said input clock signal to said semiconductor integrated circuit device;
   said first phase-delaying means is disposed in said clock signal distributing means; and
   said second phase-delaying means is disposed outside both said semiconductor integrated circuit device and said clock signal distributing means.

* * * * *